(12) United States Patent
Hershberger et al.

(10) Patent No.: US 9,118,281 B2
(45) Date of Patent: Aug. 25, 2015

(54) INTEGRATED START-UP BIAS BOOST FOR DYNAMIC ERROR VECTOR MAGNITUDE ENHANCEMENT

(71) Applicant: MICROSEMI CORPORATION, Aliso Viejo, CA (US)

(72) Inventors: Kyle Hershberger, Marietta, GA (US); Brian Eplett, Lilburn, GA (US); Mark Santini, Atlanta, GA (US)

(73) Assignee: MICROSEMI CORPORATION, Aliso Viejo, CA (US)

( * ) Notice: Subject to any disclaimer, the term of this patent is extended or adjusted under 35 U.S.C. 154(b) by 40 days.

(21) Appl. No.: 13/897,192

(22) Filed: May 17, 2013

(65) Prior Publication Data

US 2013/0307625 A1  Nov. 21, 2013

Related U.S. Application Data

(60) Provisional application No. 61/648,504, filed on May 17, 2012.

(51) Int. Cl.
*H03G 3/00* (2006.01)
*H03F 3/21* (2006.01)
(Continued)

(52) U.S. Cl.
CPC ............... *H03F 3/21* (2013.01); *H03F 1/0261* (2013.01); *H03F 1/0266* (2013.01); *H03F 1/305* (2013.01); *H03F 3/19* (2013.01); *H03G 3/004* (2013.01); *H03G 3/3042* (2013.01); *H03G 3/3047* (2013.01); *H03F 3/45475* (2013.01);
(Continued)

(58) Field of Classification Search
USPC .................................. 330/285, 296, 289, 273
See application file for complete search history.

(56) References Cited

U.S. PATENT DOCUMENTS 5,438,298 A   8/1995   Hori
6,233,440 B1   5/2001   Taylor
(Continued)

FOREIGN PATENT DOCUMENTS

EP   1976111 A2   10/2008
GB   2181916 A    4/1987

OTHER PUBLICATIONS

Calhoun, B., et al., "Standby Voltage Scaling for Reduced Power," Custom Integrated Circuits Conference, 2003, Proceedings of the IEEE 2003, Sep. 21-24, 2003, pp. 639-642.
(Continued)

*Primary Examiner* — Hieu Nguyen
(74) *Attorney, Agent, or Firm* — Marger Johnson & McCollom P.C.

(57) ABSTRACT

Devices and methods for correcting for start-up transients in integrated power amplifiers are disclosed. A delay element is arranged to produce a delay waveform signal that is responsive to an input voltage signal. A transconductance element has an input that receives the delay waveform signal and is arranged to provide an output boost current that is based on the delay waveform signal and a gain of the transconductance element. A reference element provides an output bias current that is responsive to a static reference current and the boost current. A bias element has an input that receives the bias current and is arranged to provide a bias control output. A power amplifier is responsive to the bias control output and is arranged to provide an amplified power output. In some examples, the boost current is adjusted based on a supply voltage and an input power of the power amplifier.

11 Claims, 11 Drawing Sheets

(51) Int. Cl.
*H03F 1/02* (2006.01)
*H03F 1/30* (2006.01)
*H03F 3/19* (2006.01)
*H03G 3/30* (2006.01)
*H03G 1/00* (2006.01)
*H03F 3/45* (2006.01)

(52) U.S. Cl.
CPC ....... *H03F2200/18* (2013.01); *H03F 2200/321* (2013.01); *H03F 2200/504* (2013.01); *H03F 2200/507* (2013.01); *H03G 1/0088* (2013.01)

(56) References Cited

U.S. PATENT DOCUMENTS

| | | | |
|---|---|---|---|
| 7,567,123 | B2 | 7/2009 | Leung et al. |
| 8,264,272 | B2 | 9/2012 | Zhang et al. |
| 8,692,619 | B2 * | 4/2014 | Wakita et al. ................. 330/296 |
| 2002/0153940 | A1 | 10/2002 | Wurcer et al. |
| 2005/0140437 | A1 | 6/2005 | Maclean et al. |
| 2005/0270103 | A1 | 12/2005 | Constantin |
| 2006/0164168 | A1 | 7/2006 | Liu et al. |
| 2009/0160558 | A1 | 6/2009 | Choi et al. |
| 2009/0212863 | A1 | 8/2009 | Ishimaru |
| 2011/0090011 | A1 | 4/2011 | Chang et al. |

OTHER PUBLICATIONS

Microsemi Corporation, LX5586 4.8-5.85GHz, IEEE802.11ac Front End Module, Preliminary Product Brief, Analog Mixed Signal Group, One Enterprise, Aliso Viejo, California, Rev. 0.1, Nov. 2012.
Microsemi Corporation, LX5509 InGaP 5GHz Power Amplifier, Abridged Datasheet, Analog Mixed Signal Group, One Enterprise, Aliso Viejo, California, Rev. 1.0, Dec. 19, 2012.
European Patent Office, International Search Report/Written Opinion, PCT/US2013/041671, Jul. 29, 2013, 13 pages, EPO, Rijswijk, The Netherlands.
USPTO, Office Action issued in U.S. Appl. No. 13/895,236, Dec. 18, 2014, pp. 1-17, Commissioner for Patents, Alexandria, Virginia 22313-1450.
USPTO, Sep. 25, 2014, Office Action issued in U.S. Appl. No. 14/090,401, Sep. 25, 2014, pp. 1-14, Commissioner for Patents, Alexandria, Virginia 22313-1450.

* cited by examiner

INTEGRATED START-UP BIAS BOOST FOR DYNAMIC ERROR VECTOR MAGNITUDE ENHANCEMENT

CROSS REFERENCE TO RELATED APPLICATIONS

This application claims the benefit of U.S. provisional patent application Ser. No. 61/648,504, filed May 17, 2012.

FIELD OF THE INVENTION

This disclosure relates to enhancing power amplifier performance and more particularly to enhancing power-on performance of a power amplifier in an integrated circuit.

BACKGROUND OF THE INVENTION

Power amplifiers may be integrated onto the same die as receiving or other types of amplifiers in many communications standards, such as wireless LAN. A switch permits transmission of signals through the antenna to/from either the power amplifier circuit or the receiving or other amplifier, depending on the needs of the communications circuit. When the power amplifier is transmitting signals, power is supplied to the power amplifier. When the power amplifier is not actively transmitting signals, power is not supplied to the power amplifier. Upon powering on, the power amplifier experiences a period of time during which the signal that is transmitted is changing and the transmission characteristics of the power amplifier are also changing, which is difficult to train or characterize by other circuit components or other circuits coupled to the power amplifier circuit. In some circumstances such as Wireless LAN, the receiving circuit that receives the signal transmitted from the power amplifier is arranged to determine the characteristics of the incoming signal from the power amplifier within a finite period of time after which the receiving circuit assumes that the signal changes remain consistent upon further receipt of the signal over time.

The time period during which the receiving circuit determines the characteristics of the incoming signal from the power amplifier may be relatively short, approximately 4 μs in some wireless LAN examples, compared to the time period during which the power amplifier is powering on and during which the transmission characteristics of the power amplifier signal are changing and the manner in which they are changing is also changing. This assumption of no further changes to the manner in which the signal is changing leads to the receiving circuit assuming that the power amplifier signal is not continuing to change in the same manner when in fact the characteristics of the power amplifier signal are continuing to change, which can lead to inaccuracies in how the signal is being processed by the receiving circuit.

To accommodate for changing transmission characteristics during the powering-on time period of the power amplifier, a reference circuit has been coupled to the power amplifier to generate a complementary reference current to the current flowing through the power amplifier. The complementary reference current produced by the reference circuit has an input of a voltage from a control source that is then converted to the reference current by the reference circuit. A reference circuit resistor sets both the steady state current value and the time constant or delay. A reference circuit capacitor value becomes fixed as a result of the fixed value for the reference circuit resistor. The steady state current value requires that the capacitor value be relatively large and that value can be upwards of 100 nF in some examples. It is not practical for such a large capacitor to be physically present on die and therefore it must be located off-die.

Therefore, improvements that correct for the powering-on or start-up transients that power amplifiers inherently experience that are both size and cost efficient are desirable in the art.

SUMMARY OF THE INVENTION

An object of this invention is to provide methods and device structures suitable for correcting for start-up transients in power amplifiers.

An example circuit that corrects for start-up transients in power amplifiers includes a boost generator, a reference element, a bias element, and a power amplifier. The boost generator can include a delay element, a transconductance element, or both. The delay element is arranged to produce a delay waveform signal that is responsive to an input voltage signal. The transconductance element has an input that receives the delay waveform signal from the delay element and is arranged to provide an output boost current that is based on the delay waveform signal and a gain of the transconductance element. The reference element provides an output bias current that is responsive to a static reference current and the boost current. The bias element has an input that receives the bias current and is arranged to provide a bias control output. The power amplifier is responsive to the bias control output and is arranged to provide an amplified power output. The power amplifier provides a first amount of power gain during a first time period after the power amplifier is powered on and a second amount of power gain during a second time period following the first time period after the power amplifier is powered on. The first amount of power gain is responsive to the sum of the boost current and the static reference current. The second amount of power gain is determined by decay of the output bias current to a value of the static reference current.

Methods of correcting for a start-up transient in a power amplifier include producing a boost current having a decay characteristic, producing a static reference current, summing the boost current and the static reference current, and applying the summed boost current and the static reference current to bias the power amplifier. Method of correcting for a start-up transient in power amplifiers may also include adjusting the boost current based on a supply voltage of the power amplifier and an output power of the power amplifier.

The foregoing and other objects, features and advantages of the invention will become more readily apparent from the following detailed description with reference to the accompanying drawings.

DETAILED DESCRIPTION

Figure 1:
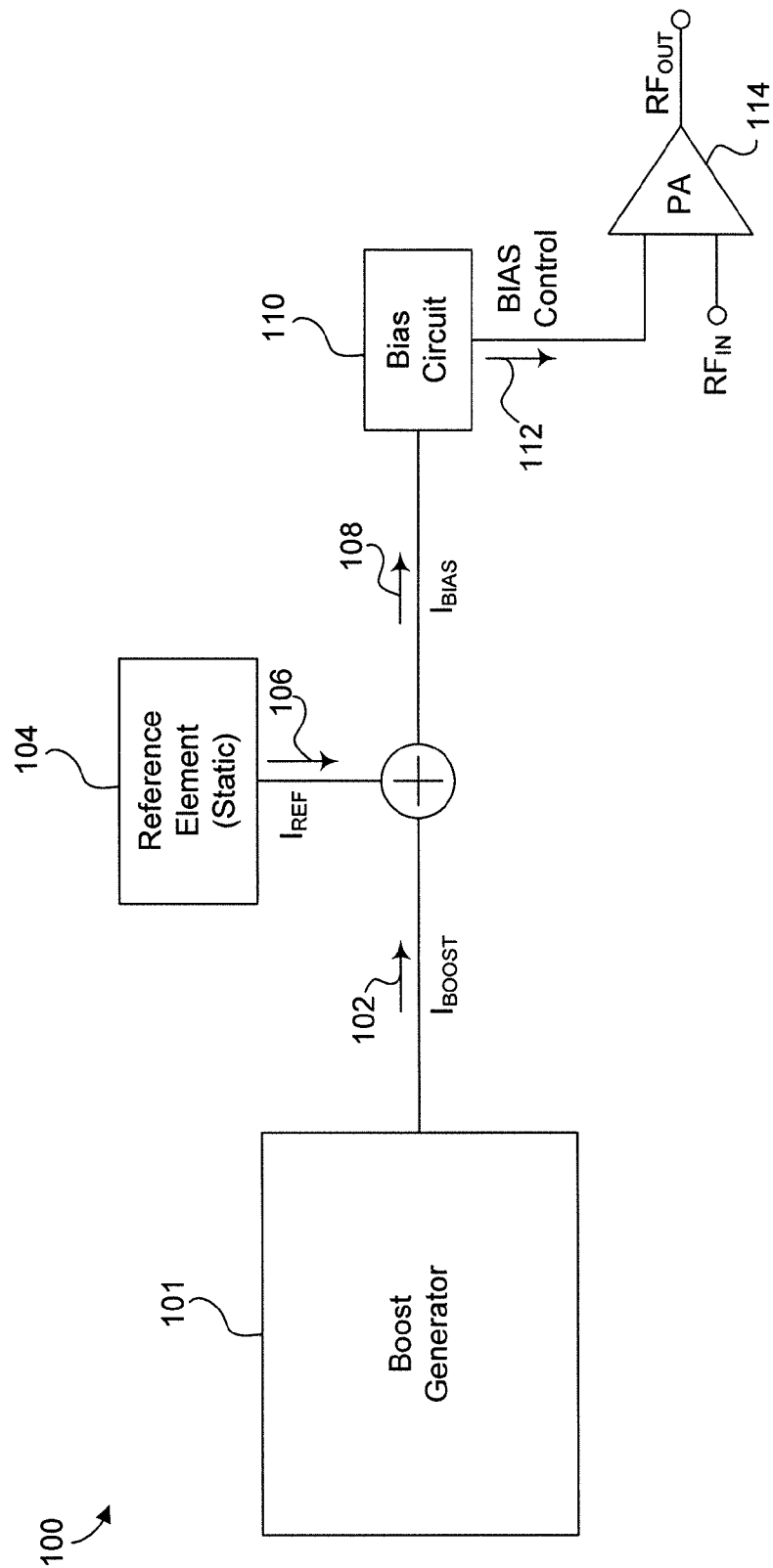
FIG. 1 is a block diagram that corresponds to elements of an integrated start-up bias boost circuit for a power amplifier, in accordance with aspects of the invention.

In the drawings, which are not necessarily to scale, like or corresponding elements of the disclosed systems and methods are denoted by the same reference numerals.

To correct for start-up transients inherent in power amplifiers, such as the LX5585 and LX5590 power amplifiers manufactured by Microsemi Corporation®, the disclosed circuits and methods provide for separating the circuit elements used to set the delay from those circuit elements used to set the output magnitude of the bias current and the characteristics of the output signal of the power amplifier. By separating the delay and the output magnitude of the bias current, the output signal of the power amplifier compensates for the start-up transients inherent in power amplifiers, in many environments, specifically in a monolithic solution for example. This arrangement can provide adjustable control mechanisms and the ability to control the circuit's behavior in any standard CMOS/BiCMOS process.

Referring now to FIG. 1, a circuit that corrects for start-up transients in power amplifiers 100 is illustrated in a block diagram. The circuit 100 includes a boost generator 101 that provides a boost current 102, a reference element 104 that provides a reference current ($I_{REF}$) 106, a bias element or bias circuit 110 that provides a bias control output 112 and a power amplifier 114. The currents $I_{BOOST}$ 102 and $I_{REF}$ are summed to produce an output bias current, $I_{BIAS}$ 108 that is received as input to the bias circuit 110. The bias circuit 110 produces a bias control output 112 based on $I_{BIAS}$ 108. The power amplifier 114 is responsive to the bias control output 112 and is arranged to provide an amplified power output ($RF_{OUT}$).

Figure 2:
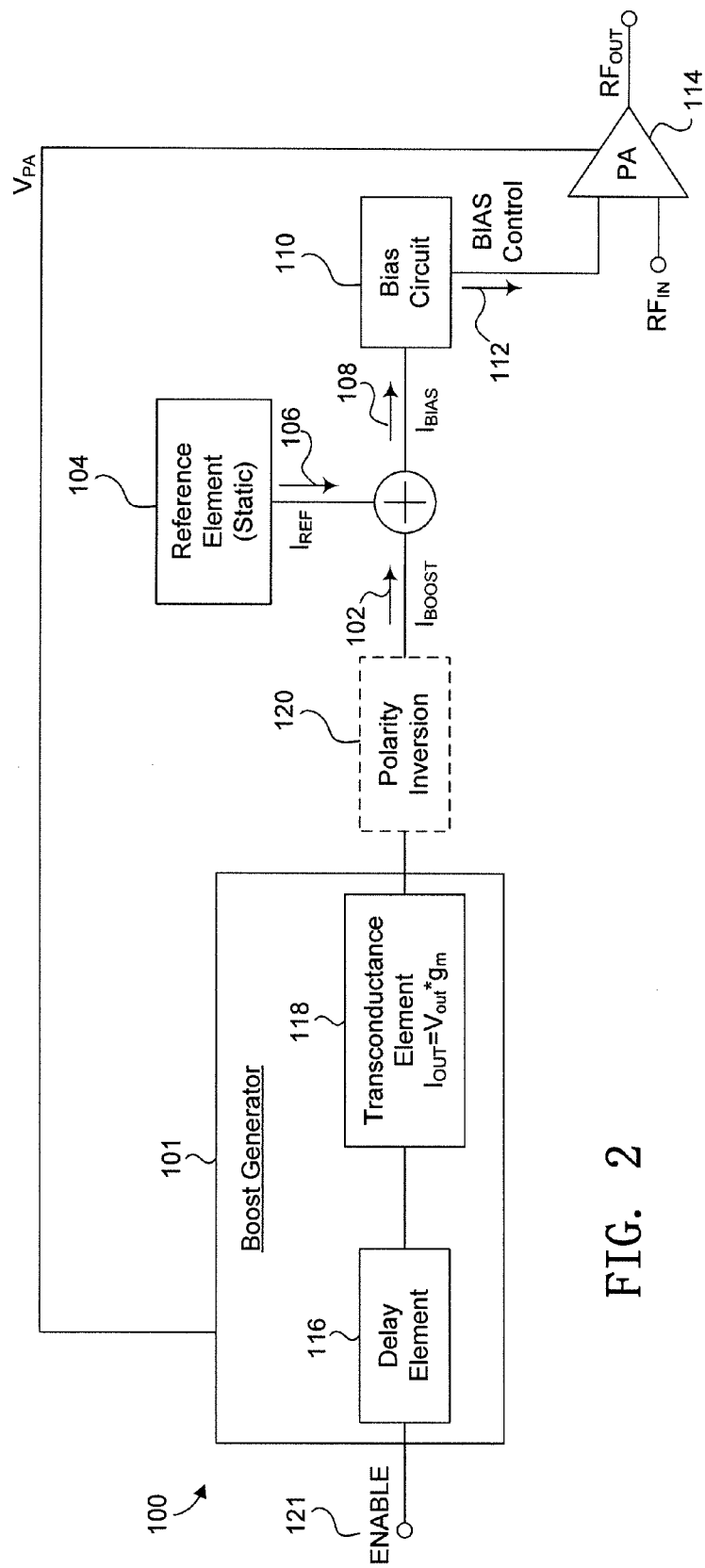
FIG. 2 is another block diagram showing elements of the integrated start-up bias boost circuit for a power amplifier shown in FIG. 1.

FIG. 2 shows a block diagram corresponding to the circuit elements shown in FIG. 1 along with additional elements of the boost generator. Specifically, the example boost generator 101 shown in FIG. 2 includes a delay element 116 and a transconductance element 118.

Optionally, the correcting circuit 100 can also include a polarity inversion circuit 120. The delay element 116 is arranged to produce a delay waveform signal that is responsive to an input signal. In other examples, a switch of any kind can generate the input voltage signal that is received at the input of the transconductance element 118. The transconductance element 118 has an input that receives the delay waveform signal from the delay element 116 and is arranged to provide an output boost current ($I_{BOOST}$) 102 that is based on the delay waveform signal and a gain of the transconductance element 118. The reference element 104 may be a bias reference element that provides a static reference current ($I_{REF}$) 106. The currents $I_{BOOST}$ 102 and $I_{REF}$ 106 are summed to produce an output bias current ($I_{BIAS}$) 108 that is received as the input to the bias circuit 110. The bias circuit 110 produces a bias control output 112 based on $I_{BIAS}$ 108. The power amplifier 114 is responsive to the bias control output and is arranged to provide an amplified power output, as discussed above.

The power amplifier 114 shown in FIGS. 1 and 2 provides a first amount of power gain during a first time period after the power amplifier is powered on and a second amount of power gain during a second time period after the power amplifier is powered on. The second time period is after the first time period in this example. The first amount of power gain is responsive to the sum of $I_{BOOST}$ and $I_{REF}$. The second amount of power gain is determined by the decay of the output bias current $I_{BIAS}$ portion of the output control bias toward a value of the static reference current, $I_{REF}$, which occurs over time. For example, the first time period and the second time period extend over about 100 µs after the power amplifier is powered on. The first time period may begin when an enabling control signal 121 is supplied to the power amplifier, in some examples, which may be concurrent with or slightly before or after the power amplifier is powered on. At the end of the first time period, the output bias current $I_{BIAS}$ value of the bias control output has peaked in value and has decayed toward the value of the static reference current $I_{REF}$.

The transconductance element 118 of the block diagram of the start-up bias boost circuit 100 illustrated in FIG. 2 converts the delay waveform signal that it receives at its input into an output current with an output gain. In some examples, the delay waveform signal includes a delay waveform voltage that is converted to an output current by the transconductance element 118. Optionally, the output current of the transconductance element 118 is received as input to a polarity inversion circuit 120. The polarity inversion circuit 120 can turn a current sink into a current source. For example, when the transconductance element 118 outputs a current that needs amplifying, then the current is transmitted through the polarity inversion circuit 120, or current mirror circuit, to amplify the current to its maximum value. When the output current of the transconductance element 118 is correct, such as being equal to its maximum value, then the polarity inversion circuit 120 can be bypassed. Regardless, the output current of the transconductance element 118, whether or not it passes through the polarity inversion circuit 120, produces the output boost current, $I_{BOOST}$ 102. In the examples in which the output current of the transconductance element 118 is transmitted through the polarity inversion circuit 120, the polarity inversion circuit 120 receives the boost current from the output of the transconductance element 118 and is arranged to provide an output current that is a mirrored boost current. The mirrored boost current or simply the boost current is depicted as $I_{BOOST}$ in FIG. 2.

The output bias current, $I_{BIAS}$, is responsive to $I_{BOOST}$ or the mirrored boost current, depending on whether the current is transmitted through the polarity inversion circuit 120. In the examples in which the current is transmitted through the polarity inversion circuit 120, the output bias current, $I_{BIAS}$, is the sum of the static reference current, $I_{REF}$, and the mirrored boost current. In the examples in which the current bypasses the polarity inversion circuit 120, the output bias current, $I_{BIAS}$, is the sum of the static reference current $I_{REF}$ and the boost current output from the transconductance element 118.

Figure 3A:
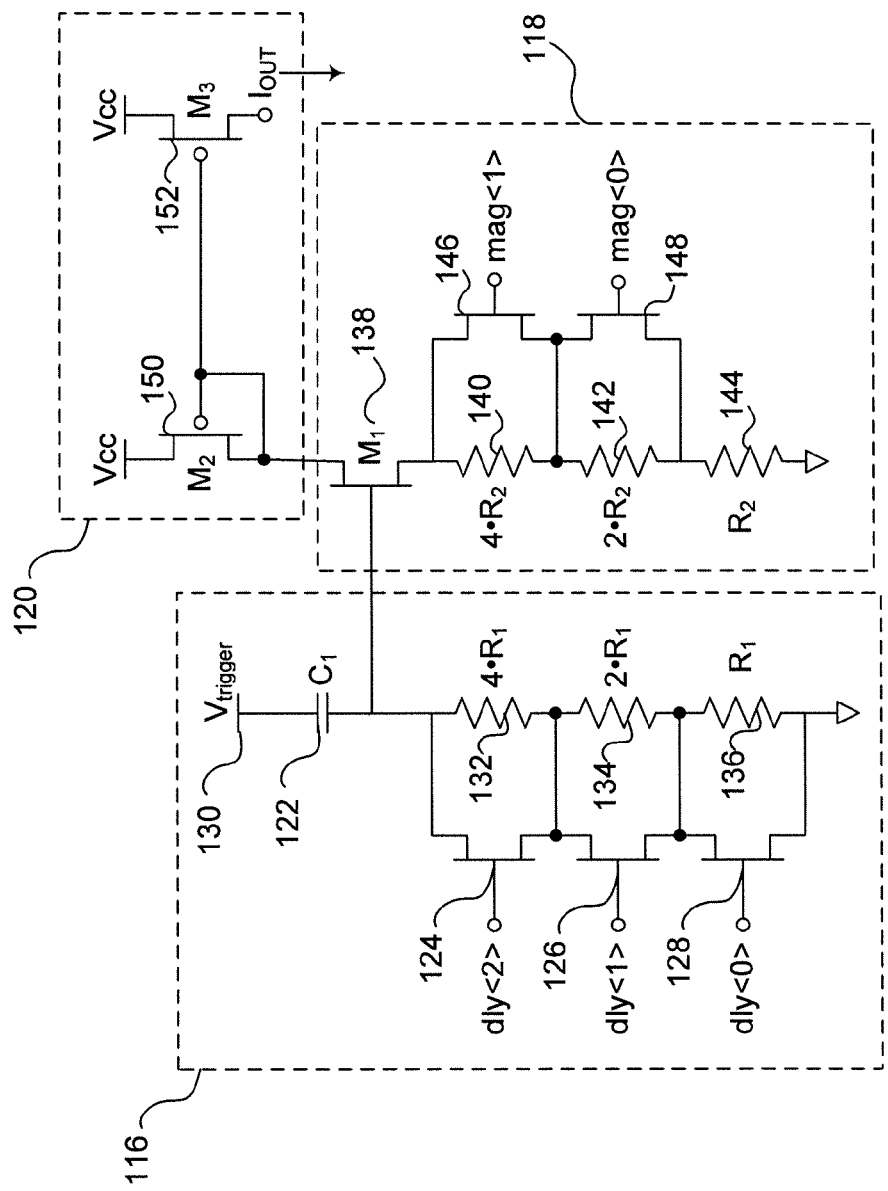
FIG. 3A is a schematic of an example delay element, transconductance element, and optional polarity inverter of an integrated start-up bias boost circuit for a power amplifier in accordance with aspects of the disclosure.
Figure 3B:
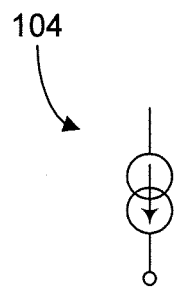
FIG. 3B is a schematic of an example bias reference element of an integrated start-up bias boost circuit for a power amplifier, according to aspects of the disclosure.
Figure 3C:
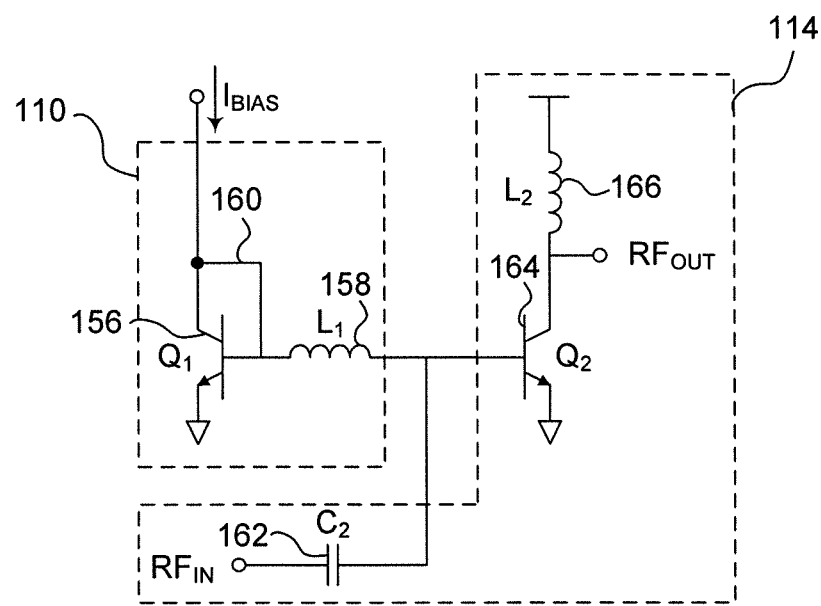
FIG. 3C is a schematic of an example bias circuit and a power amplifier of an integrated start-up bias boost circuit for a power amplifier, in accordance with aspects of the disclosure.

FIGS. 3A-3C show example schematics of some elements of the start-up bias boost circuit 100 discussed in FIGS. 1 and 2. These are examples and other embodiments of the correcting circuits may be implemented in accordance with this disclosure. FIG. 3A is an example schematic of a delay element 116, a transconductance element 118, and a polarity inversion circuit 120. The delay element 116 can be a resistor-capacitor (RC) charge circuit, in some examples, in which a capacitor 122 begins to charge when the trigger voltage input 130 transitions from low (0V) to high. A combination of the delay switches 124, 126, 128 are closed to select one of delays d<0>, d<1>, or d<2>. The voltage input 130 to the delay element 116 ranges from 0V when voltage is not being supplied to the delay element 116 to approximately 3.3V when voltage is supplied to the delay element 116 and the capacitor 122 begins to charge the RC charge circuit, for example. In alternative examples, the delay element can include one or more simple switches or other circuit elements that provide power to the start-up bias boost circuit.

In the example shown in FIG. 3A, the delay element 116 includes the capacitor 122 and a series of digitally controllable resistors 132, 134, 136 electrically coupled together in series. However, in alternative examples, the capacitor may be electrically coupled to a single resistor or any other suitable number of resistors. In addition, switching elements may be used in combination with multiple capacitors to provide adjustable delays. Again referring to FIG. 3A, the series of resistors 132, 134, 136 are digitally selectable by their respective switches 124, 126, 128, such as field effect transistors (FETs) for example, or any other suitable switch. In this example, when FETs 124, 126 are closed (conducting) and FET 128 is open (non-conducting), the resistance of the delay element 116 becomes the value of $R_1$. When FETs 124, 128 are closed and FET 126 is open, the resistance becomes the value of $2*R_1$, in this example. When FETs 126, 128 are closed and FET 124 is open, the resistance of the delay element 116 becomes the value of $4*R_1$, in this example. By varying the FETs 124, 126, 128 that are open and closed, the resistance value of the delay element 116 can be controlled. By controlling the resistance value of the delay element 116, the delay waveform signal's response to the input voltage signal received by the delay element 116 can also be controlled.

The output voltage signal of the delay element 116 is received at the input of the transconductance element 118, which produces an output boost current. The transconductance element 118 includes an amplifying device 138 or transistor and a series of resistors 140, 142, 144 electrically coupled together in series. In the example transconductance element 118 shown in FIG. 3A, the amplifying device 138 is a FET, for example, or can be any other suitable type of amplifying device. The resistors 140, 142, 144 can be one large resistor in other examples. However, in FIG. 3A, the resistors 140, 142, 144 are a series of three digitally selectable resistors electrically coupled together in series. These resistors 140, 142, 144 are digitally controlled by two switches 146, 148 that vary the resistance and thus the output boost current that is output from the transconductance element 118. The transconductance element 118 has a minimum resistance of $R_2$ that may increase depending on whether one or both of the switches 146, 148 are open or closed.

The output boost current of the transconductance element 118 is received as input to the polarity inversion circuit 120 shown in FIG. 3A. The polarity inversion circuit 120 includes two metal oxide semiconductor field effect transistors 150, 152 (MOSFETs), in this example, electrically coupled in series to each other. The polarity inversion circuit 120 generates a mirrored output boost current that is greater than, but directly proportional to the boost current output by the transconductance element 118.

FIG. 3B is an example reference element 104. The reference element 104 can be a static reference element that is arranged to provide a static reference current that sets an operating parameter of the power amplifier, namely the current that flows through the power amplifier's bipolar transistor.

Turning now to FIG. 3C, example schematics of the bias circuit 110 and the power amplifier 114 are shown. The bias circuit 110 receives the summed bias current of the output boost current, the output current from FIG. 3A, and the static reference current, the output current from FIG. 3B. The bias circuit 110 shown in FIG. 3C includes a bipolar transistor 156 and an inductor 158 electrically coupled in series with each other. A bypass pathway 160 couples the gate to the collector of the bipolar transistor 156, thus effectively turning the bipolar transistor 156 into a diode. The bias circuit 110 provides an elevated bias voltage to the power amplifier 114 when the power amplifier 114 is powered on, which helps to correct for the changes in performance characteristics of the power amplifier 114 during the powering on time period.

FIG. 3C also shows an example schematic of a power amplifier 114 having a capacitor 162, a bipolar transistor 164, and an inductor 166. An input signal to the power amplifier 114 is a radio frequency (RF) input and the output of the power amplifier 114 is an RF output signal that is amplified by a gain defined by the power amplifier 114. When the power amplifier 114 is powered off, the current through the bipolar transistor 164 of the power amplifier 114 is essentially zero. When the power amplifier 114 is powered on, the current through the bipolar transistor 164 rapidly changes and then gradually approaches its steady state value. During the time period when the current through the bipolar transistor 164 is changing, the RF characteristics of the power amplifier 114 are also changing. The steady state value of the current through the bipolar transistor 164 of the power amplifier 114 is proportional to the value of the static reference current 106. The bias control current is a current boost that, when summed with the static reference current and input into the power amplifier 114, helps to correct for the changes to the RF characteristics of the power amplifier 114 when it is powered on during its "transient" period, which otherwise has a negative impact on the overall system performance.

The bias circuit 110 generates the bias voltage for the bipolar transistor 164 of the power amplifier 114. The operating point of the bipolar transistor 164 of the power amplifier 114 is set by the static reference current that flows through the reference device 156 of the bias circuit 110. As discussed above, the input current to the bias circuit 110 is generated by summing the static reference current and the output current boost. When the power amplifier 114 is powered off, the control voltage 130 ($V_{trigger}$) to the start-up bias boost circuit 100 is brought to ground, which resets the circuit 100 in the examples shown in FIGS. 1-3C. In alternative embodiments, the circuit 100 can have a constant supply voltage (although the value of the supply voltage may vary) and the circuit can be reset through other ways, such as FET switches.

In the examples shown in FIGS. 3A-3C, the start-up bias boost circuit 100 has two design equations:

$$t_{delay} = (R_1 * C_1) \text{ seconds}$$

$$I_{BOOST,max} = (V_{CC} - V_{M1})/R_2 \text{ amps}$$

The start-up bias boost circuit design equations have three degrees of freedom—$C_1$, $R_1$, and $R_2$. $C_1$ is the capacitor 122 included in the delay element 116 of the start-up bias boost circuit 100 and is generally fixed by layout constraints and can be chosen to be as large as conventionally possible. To achieve the desired delay, which is in the range of 100's of µs, $R_1$ corresponding to the resistance value 132, 134, 136 of the delay element 116 also tends to be relatively large, such as 2 MΩ. To achieve the desired magnitude of the output boost current, the value of $R_2$ corresponding to the resistance value 140, 142, 144 of the transconductance element 118 can be chosen independently of $R_1$ and $C_1$. All three degrees of freedom, $C_1$, $R_1$, and $R_2$, are controllable to change the value of the desired delay and the output boost current.

As discussed above, before the power amplifier 114 is powered on, the control voltage 130 to the delay element 116 is zero, which means that all node voltages are also zero and the static reference current is zero. The diode 156 in the bias circuit 110 and the bipolar transistor 164 in the power amplifier 114 are off and the voltage across $C_1$ 122 of the delay element 116 is zero. When the power amplifier 114 is powered on, the static reference current is turned on, in some examples to a value of 100 µA. The control voltage 130 to the boost circuit 100 is also brought up to a desired value, in some examples to 3.3V. The transition of control voltage 130 may be coincident, slightly before, or slightly after the static reference current is turned on. The voltage across $C_1$ 122 is still zero, which brings the gate voltage of the transistor 138 in the transconductance element 118 up to the control voltage 130, which causes the transistor 138 to turn on. The source degeneration provided by $R_2$ 140, 142, 144 limits the drain current, which allows for the current through transistor 138 to be approximately $I_{BOOST,max}=(V_{CC}-V_{M1})/R_2$, as discussed above.

With increasing time, the voltage across $C_1$ 122 increases with an inverse exponential characteristic. The rate at which the voltage across $C_1$ 122 increases is controlled by the value of $R_1$ 132, 134, 136. As $C_1$ 122 charges, the gate voltage of transistor 138 in the transconductance element 118 decreases exponentially, which causes the current that flows through transistor 138 to decrease exponentially as well. This decrease in the current that flows through transistor 138 generates an exponential decay of the output boost current. When the voltage across $C_1$ 122 becomes equal to $V_{CC}-V_{Threshold\,voltage\,of\,M1}$, which happens over time, transistor 138 turns off and the current through transistor 138 becomes zero. This change results in the output boost current decaying to zero and the bias current becomes equal to the static reference current, which is the desired steady state condition.

Figure 4:
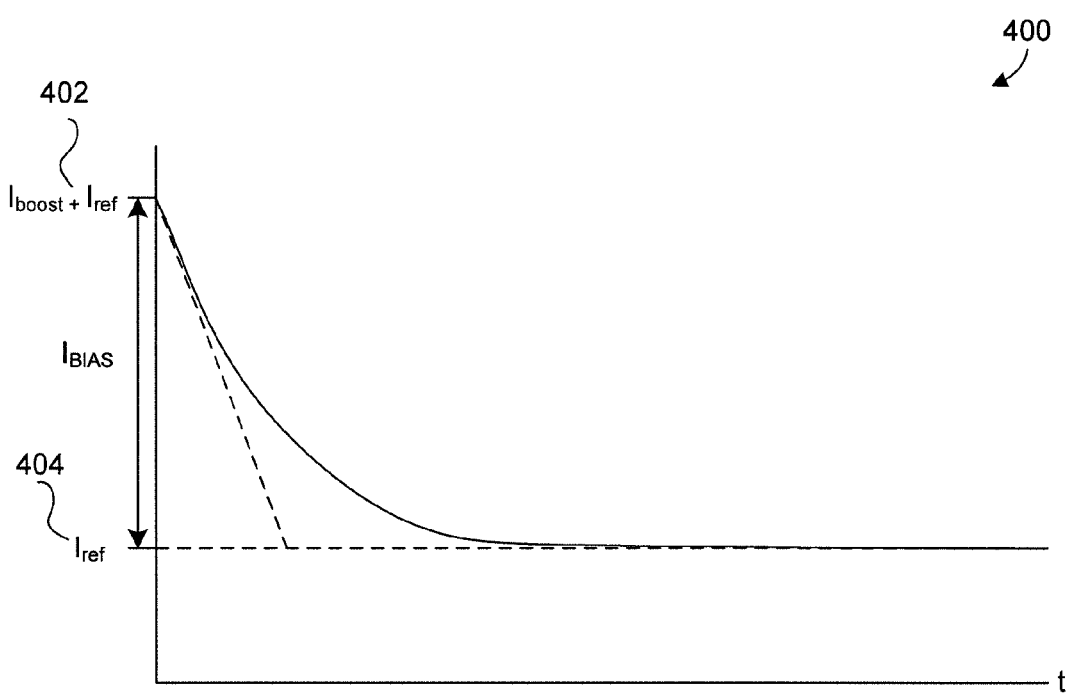
FIG. 4 is a graphical representation of bias current over time, according to aspects of the disclosure.

FIG. 4 is a graphical representation of the bias current over time 400 as it peaks to a value of the sum of the output boost current and the static reference current 402, then decays to a value of the static reference current 404. Referring again to the power gain of the power amplifier, the second amount of power gain provided by the power amplifier during a second time period after the power amplifier is powered on is determined by the exponential decay of the output bias current toward the value of the static reference current during the second time period. In some examples, the second time period begins when the second amount of power gain has reduced to a value acceptably close to the steady state amount of power gain. The first amount of power gain of the power amplifier is measured from the beginning of the first time period. The time constant can be defined as the amount of time between the initial powering on of the power amplifier (thus starting the first time period) and the time when the magnitude of the power gain of the power amplifier is close enough to its steady state value to induce an acceptably small error to the output signal. The power gain of the power amplifier is proportional to the exponential decay of the output bias current, as depicted in FIG. 4.

Figure 5:
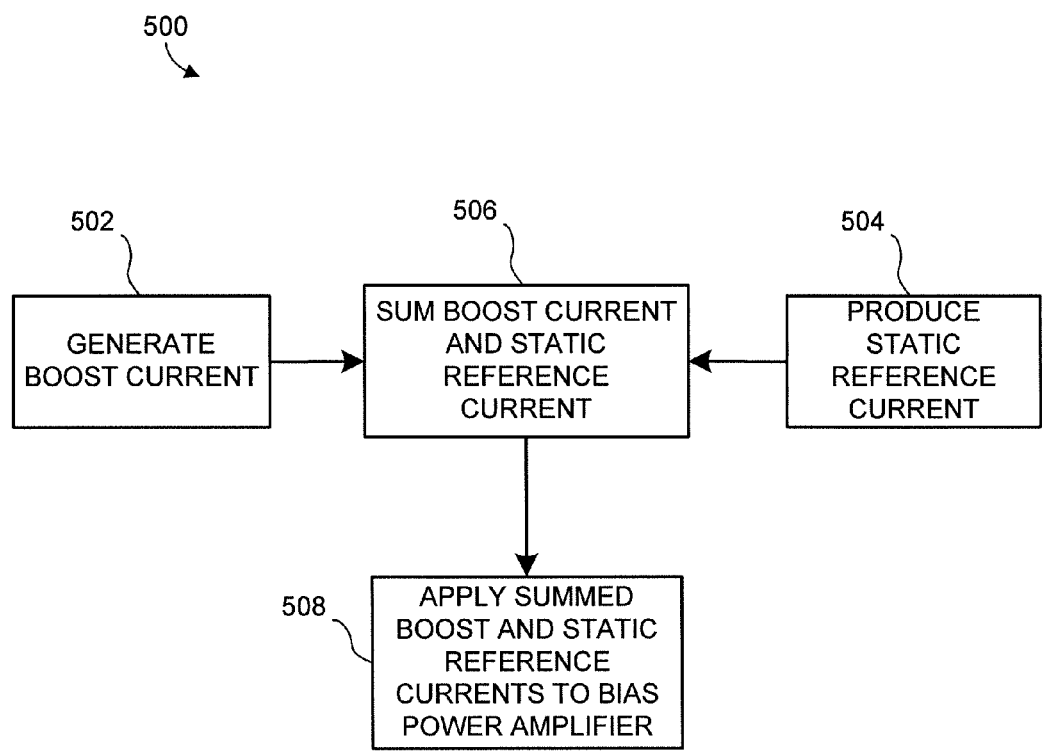
FIG. 5 shows steps in a method of correcting for a start-up transient in a power amplifier, in accordance with aspects of the disclosure.

Referring now to FIG. 5, steps in a method 500 for correcting for a start-up transient in a power amplifier are shown. The steps include producing a boost current that has a decay characteristic 502, producing a static reference current 504, summing the boost current and the static reference current 506, and applying the summed boost current and the static reference current to bias a power amplifier 508. As discussed above, the power amplifier provides a first amount of power gain during a first time period after the power amplifier is powered on and a second amount of power gain during a second time period subsequent to the first time period after the power amplifier is powered on. The first amount of power gain is responsive to the sum of the boost current and the static reference current and the second amount of power gain is determined by the decay of the summed boost current to a value of the static reference current.

FIGS. 6-10 show another example integrated start-up bias boost circuit for correcting circuit 600. Similar to the correcting circuit 100 shown in FIGS. 1-5 and discussed above, the correcting circuit 600 corrects for start-up transients inherent in power amplifiers by separating the circuit elements used to set the delay from those circuit elements used to set the output magnitude of the bias current and the characteristics of the output signal of the power amplifier. However, the correcting circuit 600 shown in FIGS. 6-10 can also include two scaling operations. Both the supply voltage of the power amplifier and the $RF_{OUT}$ or power level input of the power amplifier affect the magnitude of the thermal event that occurs when the power amplifier turns on. Because the magnitude of the thermal event is affected, the amount of boost current required also changes.

The varying levels of boost current required because of the effects of the supply voltage on the power amplifier can be corrected by scaling the original boost current by a scaling factor. The scaling factor is proportional to the power amplifier's supply voltage ($V_{PA}$). The varying levels of boost current that are required due to the effect of the RF drive on the power amplifier is handled by further scaling the original boost current by a scaling factor that is proportional to the magnitude of the RF signal, $RF_{OUT}$.

Figure 6:
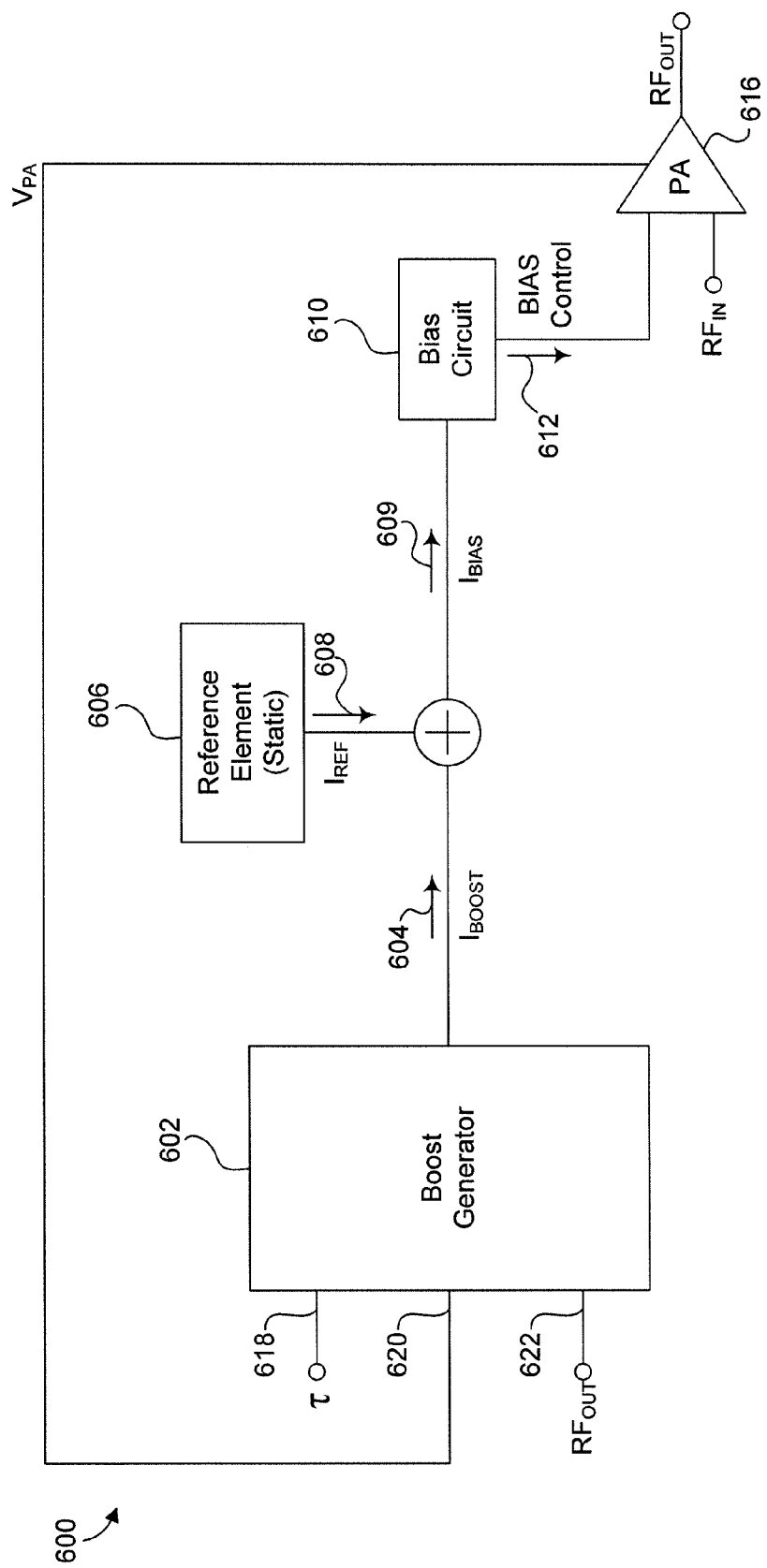
FIG. 6 is a block diagram that corresponds to another embodiment of an integrated start-up bias boost circuit for a power amplifier.

By adjusting the magnitude of $I_{BOOST}$ by the scaling factor that is based on the $RF_{OUT}$ and the $V_{PA}$, the correcting circuit 600 achieves dynamic scaling of $I_{BOOST}$. FIG. 6 is a block diagram of an example correcting circuit 600 that includes scaling of $I_{BOOST}$ based on $RF_{OUT}$ and the $V_{PA}$. The correcting circuit 600 includes a boost generator 602, a reference element 606, a bias element or bias circuit 610, and a power amplifier 616. The boost generator includes three inputs: a time constant 618, $V_{PA}$ 620, and $RF_{OUT}$ 622, which in combination adjust the $I_{BOOST}$ 604 output by the boost generator 602 based on values associated with the power amplifier 616. Because the values associated with the power amplifier 616 change during the transient period when the power amplifier is turned on, the boost generator corrects for the thermal event of the turn on by scaling $I_{BOOST}$ to adjust based on the changing supply voltage and output power values of the power amplifier.

Similar to the correcting circuit 100 described above, the correcting circuit 600 shown in FIG. 6 has a reference element 606 that provides a reference current ($I_{REF}$) 608. Currents $I_{BOOST}$ and $I_{REF}$ are summed to produce an output bias current, $I_{BIAS}$, 609 that is received as input to the bias circuit 610.

The bias circuit 610 produces a bias control output 612 that is based on $I_{BIAS}$ 609. The power amplifier 616 is responsive to the bias control output 612 and is arranged to provide an amplified power output.

Figure 7:
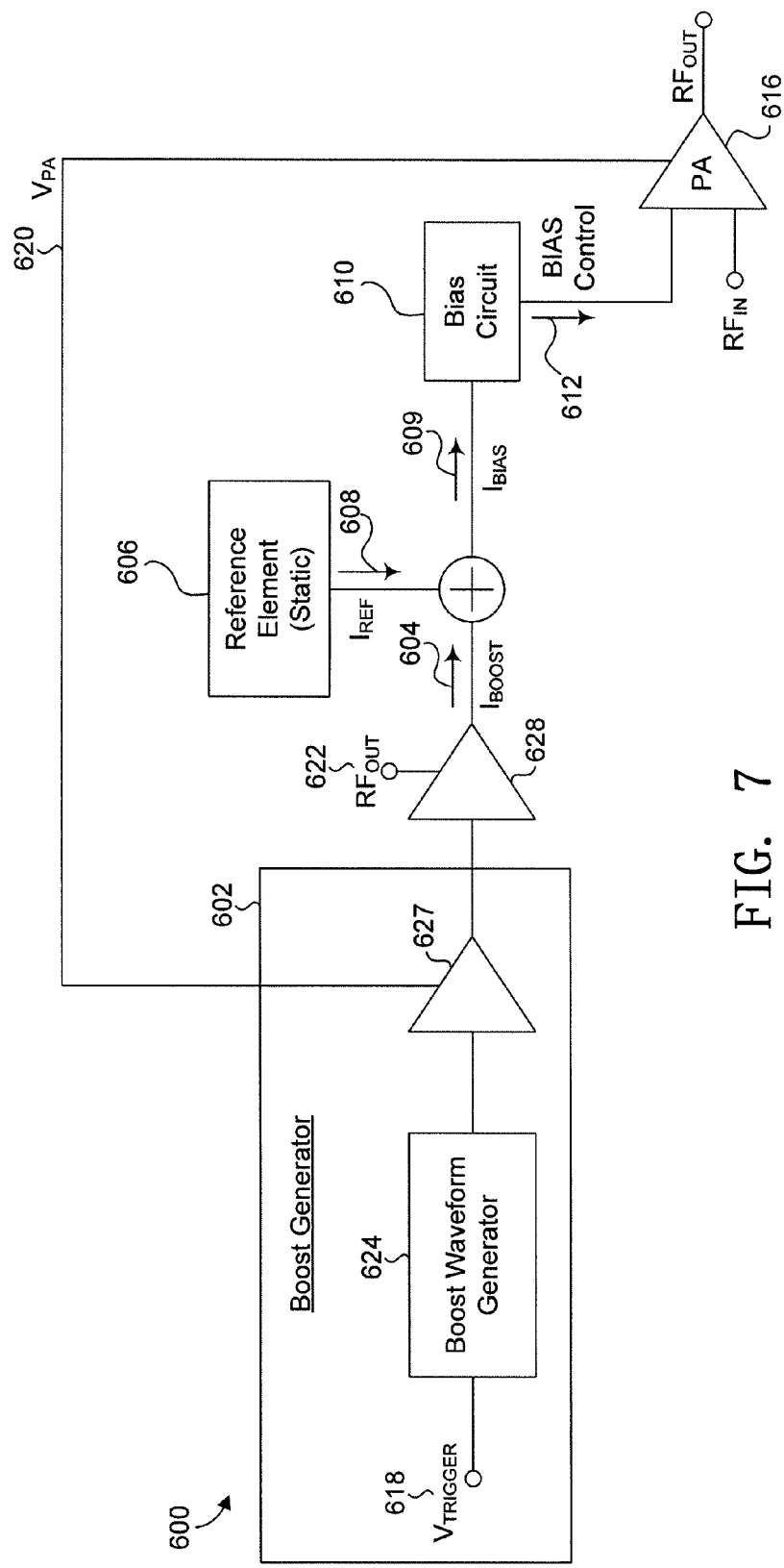
FIG. 7 is another block diagram corresponding to some elements of the boost generator of FIG. 6.

FIG. 7 shows another block diagram of the correcting circuit 600 with a more detailed illustration of scaling $I_{BOOST}$ 604. The boost generator 602 includes the trigger voltage ($V_{trigger}$) input 618 that is provided as input to the boost waveform generator 624. The output of the boost waveform generator 624 is input to an amplifier 627 with $V_{PA}$ 620 as its gain control input. The amplifier 627 with $V_{PA}$ 620 as its input adjusts the output $I_{BOOST}$ by a scaling factor that is based on $V_{PA}$. The output of amplifier 627 is input to a second amplifier 628 with $RF_{OUT}$ of the power amplifier 616 as its gain control input. The amplifier 627 further adjusts the output $I_{BOOST}$ 604 from the boost generator 602 by a scaling factor that is based on $RF_{OUT}$ 622 of the power amplifier 627. The output of the $V_{PA}$ and $RF_{OUT}$ scaled $I_{BOOST}$ is then summed with $I_{REF}$, as described above.

Figure 8:
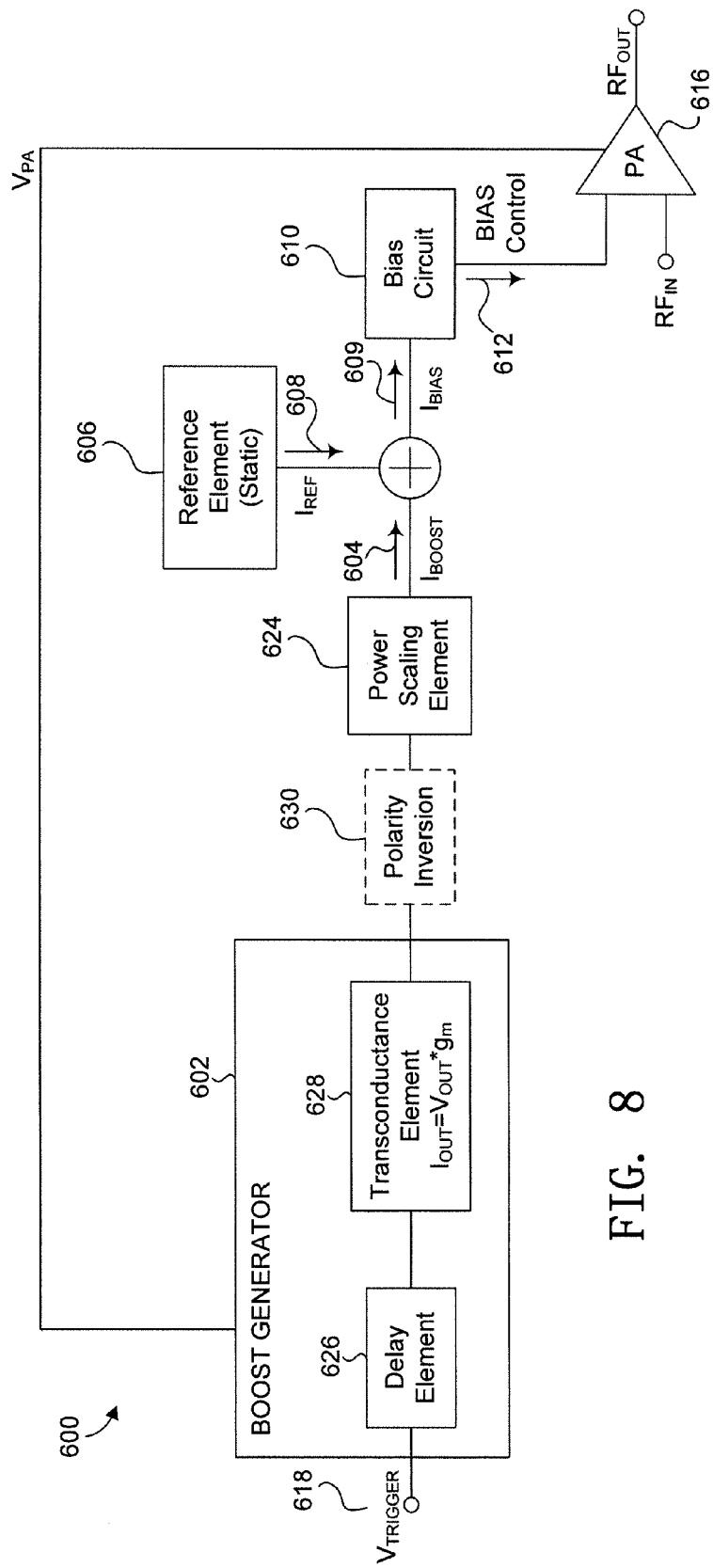
FIG. 8 is yet another block diagram that corresponds to some additional and optional elements of the integrated start-up bias boost circuit shown in FIG. 6.

FIG. 8 shows yet another block diagram of the correcting circuit 600 that adjust $I_{BOOST}$ by a scaling factor that is based on $V_{PA}$ and $RF_{OUT}$. As discussed above, the boost generator 602 can include a delay element 626 and a transconductance element 628. However, different from the example correcting circuit 100 discussed above, the correcting circuit 600 that scales $I_{BOOST}$, includes a transconductance element 628 in which the output current is based on the delay waveform signal and the magnitude of the output voltage of the delay element 626 is proportional to $V_{PA}$.

The output current, $I_{BOOST}$, of the boost generator is input to an optional polarity inverter 630 in a manner similar to the polarity inverter discussed above in FIG. 2. The output of the polarity inverter 630 is a current input to a power scaling element 624. The output current of the power scaling element 624 is scaled $I_{BOOST}$, which is adjusted by a scaling factor that is proportional to the output power of the power amplifier As discussed above, $I_{BOOST}$ is summed with $I_{REF}$ to produce $I_{BIAS}$ 609, which is input to the bias circuit 610. The output of the bias circuit is bias control 612 which is an input to the power amplifier 616.

Figure 9:
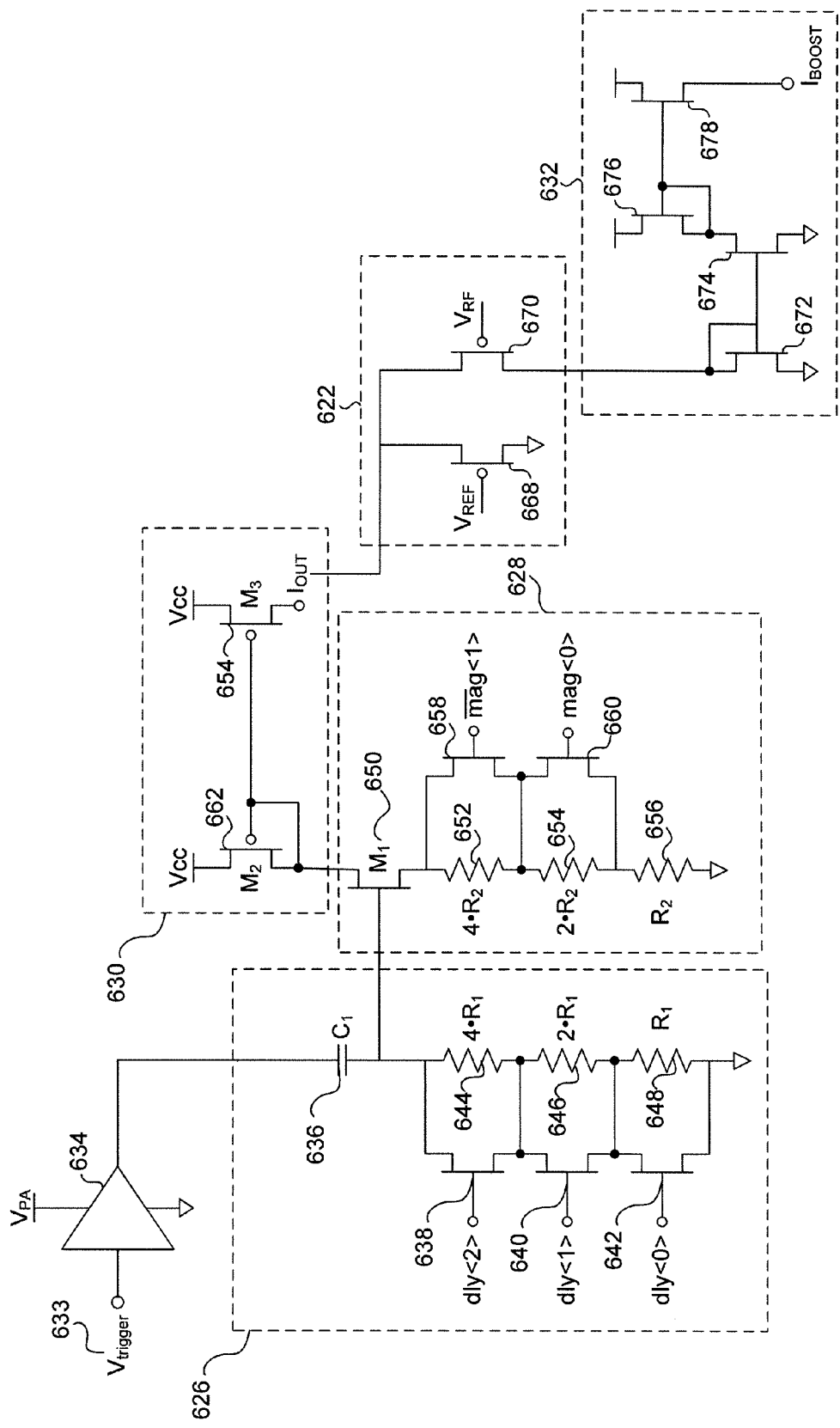
FIG. 9 is an example schematic of the integrated start-up bias boost circuit shown in FIG. 8.

FIG. 9 is an example schematic showing a delay element 626, a transconductance element 628, a polarity inversion circuit 630, a power scaling element 622, and a polarity and gain element 632. Similar to the correcting circuit 100 described in FIG. 3A, the delay element 626 can be a resistor-capacitor (RC) charge circuit in which a capacitor 636 begins to charge when the trigger voltage input ($V_{trigger}$) 633 transitions from low (0V) to high. $V_{trigger}$ 633 is input to an amplifier 634 that also receives input from $V_{PA}$, thereby adjusting the ultimate $I_{BOOST}$ based on $V_{PA}$. A combination of delay switches 638, 640, 642 are closed to select one of delays d0, d1, d2, d3, d4, d5, d6, and d7. Simple switches or other circuit elements can also be used. The delay element 626 includes a capacitor 636 and a series of digitally controllable resistors 644, 646, 648 that are electrically coupled to each other in series. Any suitable adjustable delay can be used. By controlling the resistance value of the delay element 626, the delay waveform signal's response to the input voltage signal received by the delay element 626 can also be controlled.

The output voltage signal of the delay element 626 is received at the input of the transconductance element 628. The transconductance element 628 includes an amplifying device 650 or transistor and a series of resistors 652, 654, 656 electrically coupled together in series. In the example transconductance element shown in FIG. 9, the amplifying device 650 is a FET, for example, or can be any other suitable type of amplifying device. The resistors 652, 654, 656 are a series of three digitally selectable resistors electrically coupled together in series. Resistors 652, 654, 656 are digitally controlled by two switches 658, 660 that vary the resistance and thus the output boost current that is output from the transconductance element 628.

The output boost current of the transconductance element 628 is received as input to the polarity inversion circuit 630 shown in FIG. 9. The polarity inversion circuit 630 includes two MOSFETs 662, 664, in this example, that are electrically coupled in series to each other. The polarity inversion circuit 630 generates a mirrored output boost current that is greater than, but directly proportional to the boost current output by the transconductance element 628.

The output boost current of the polarity inversion circuit 630 is received as input to the power scaling element 622. The power scaling element 622 includes two parallel MOSFETs 668, 670. MOSFET 668 has a reference voltage input ($V_{REF}$) and MOSFET 670 has a reference voltage ($V_{REF}$) and a voltage proportional to the RF power level of the power amplifier ($V_{RF}$). Both $V_{REF}$ and $V_{RF}$ are supplied by a power detector (not shown) that is located elsewhere on the die from the power amplifier and the correcting circuit described herein. $V_{REF}$ is a reference voltage from the power detector and $V_{RF}$ is a signal such that $V_{RF}$-$V_{REF}$ is proportional to the RF power level of the disclosed power amplifier. The output of power scaling circuit 622 can be taken from either device 668 or 670 depending on the polarity of scaling desired.

The output of the power scaling element 622 is received as input to an optional polarity and gain element 632. The polarity and gain element 632 includes a gain portion that includes two MOSFETs 672, 674 electrically coupled in series with each other. The polarity and gain element 632 also includes a polarity inversion circuit portion in series with the gain portion. The polarity inversion circuit portion includes two MOSFETs electrically coupled in series with each other 676, 678. The output of the polarity and gain element 632 is $I_{BOOST}$, adjusted so it is scaled to $RF_{OUT}$ and $V_{PA}$.

Figure 10:
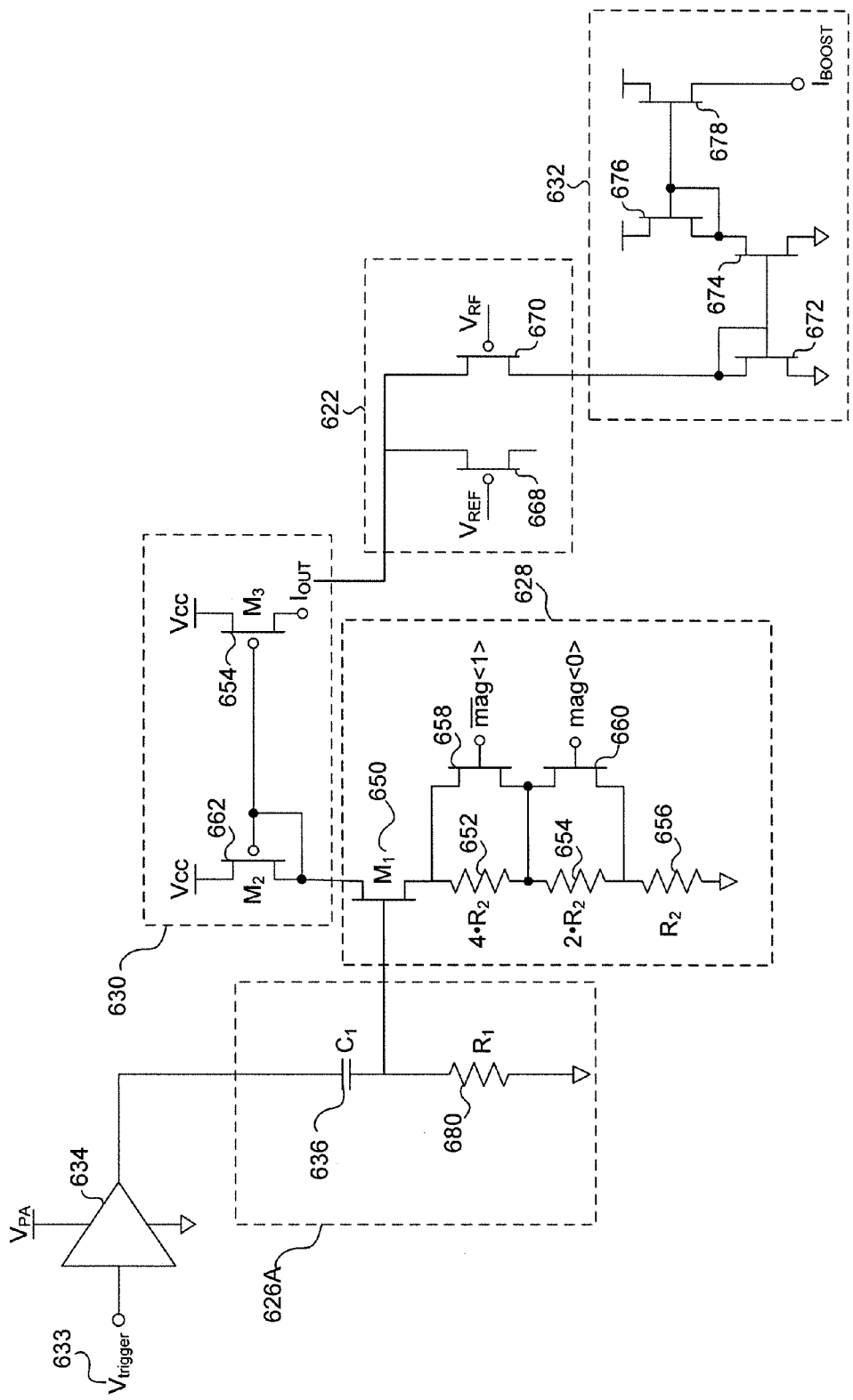
FIG. 10 is another example schematic of the integrated start-up bias boost circuit shown in FIG. 8.

FIG. 10 is another correcting circuit that scales $I_{BOOST}$ based on $V_{PA}$ and $RF_{OUT}$. Instead of a selectable delay 626 that includes the delay switches 638, 640, 642 and the resistors 644, 646, 648 shown in FIG. 9, the correcting circuit 600 in FIG. 10 includes delay 626A having a single resistor 680. Alternatively, the delay element could be a series of resistors or any other suitable resistance element(s).

Having described and illustrated the principles of the invention in a preferred embodiment thereof, it should be apparent that the invention can be modified in arrangement and detail without departing from such principles. We claim all modifications and variations coming within the spirit and scope of the following claims.

The invention claimed is:

1. A circuit that corrects for start-up transients in power amplifiers, comprising:
   a boost generator arranged to provide a boost current;
   a reference element that provides an output bias current responsive to a static reference current and the boost current;
   a bias element having an input that receives the bias current and is arranged to provide a bias control output;
   a power amplifier responsive to the bias control output and arranged to provide an amplified power output, wherein the power amplifier provides a first amount of power gain during a first time period after the power amplifier is powered on, the first amount of power gain responsive to the sum of the boost current and the static reference current and a second amount of power gain during a second time period after the power amplifier is powered on, the second time period following the first time period, the second amount of power gain determined by decay of the output bias current to a value of the static reference current; and
a polarity inversion circuit having an input that receives the boost current and is arranged to provide an output that is a mirrored boost current, wherein the bias current is responsive to the mirrored boost current.

2. The circuit of claim 1, wherein the output bias current is the sum of the static reference current and the mirrored boost current.

3. A circuit that corrects for start-up transients in power amplifiers, comprising:
a boost generator arranged to provide a boost current, the boost generator includes a delay element and a transconductance element and wherein the delay element includes a capacitor and a first resistor, a second resistor, and a third resistor that are electrically coupled together in series and are digitally controllable;
a reference element that provides an output bias current responsive to a static reference current and the boost current;
a bias element having an input that receives the bias current and is arranged to provide a bias control output; and
a power amplifier responsive to the bias control output and arranged to provide an amplified power output, wherein the power amplifier provides a first amount of power gain during a first time period after the power amplifier is powered on, the first amount of power gain responsive to the sum of the boost current and the static reference current and a second amount of power gain during a second time period after the power amplifier is powered on, the second time period following the first time period, the second amount of power gain determined by decay of the output bias current to a value of the static reference current.

4. A circuit that corrects for start-up transients in power amplifiers, comprising:
a boost generator arranged to provide a boost current, the boost generator includes a delay element and a transconductance element, the transconductance element includes a switch and at least one resistor electrically coupled together in series;
a reference element that provides an output bias current responsive to a static reference current and the boost current;
a bias element having an input that receives the bias current and is arranged to provide a bias control output;
a power amplifier responsive to the bias control output and arranged to provide an amplified power output, wherein the power amplifier provides a first amount of power gain during a first time period after the power amplifier is powered on, the first amount of power gain responsive to the sum of the boost current and the static reference current and a second amount of power gain during a second time period after the power amplifier is powered on, the second time period following the first time period, the second amount of power gain determined by decay of the output bias current to a value of the static reference current.

5. A circuit that corrects for start-up transients in power amplifiers, comprising:
a boost generator arranged to provide a boost current, the boost generator includes a delay element and a transconductance element, the delay element is arranged to produce a delay waveform signal responsive to an input voltage signal and the transconductance element has an input that receives the delay waveform signal from the delay element and is arranged to provide the output boost current, the output of the transconductance element is adjusted by a scaling factor that is based on a supply voltage of the power amplifier, wherein the transconductance element includes a first resistor, a second resistor, and a third resistor that are electrically coupled together in series and are digitally controllable;
a reference element that provides an output bias current responsive to a static reference current and the boost current;
a bias element having an input that receives the bias current and is arranged to provide a bias control output; and
a power amplifier responsive to the bias control output and arranged to provide an amplified power output, wherein the power amplifier provides a first amount of power gain during a first time period after the power amplifier is powered on, the first amount of power gain responsive to the sum of the boost current and the static reference current and a second amount of power gain during a second time period after the power amplifier is powered on, the second time period following the first time period, the second amount of power gain determined by decay of the output bias current to a value of the static reference current.

6. A circuit that corrects for start-up transients in power amplifiers, comprising:
a boost generator arranged to provide a boost current, the boost generator includes a delay element and a transconductance element, the delay element is arranged to produce a delay waveform signal responsive to an input voltage signal and the transconductance element has an input that receives the delay waveform signal from the delay element and is arranged to provide the output boost current, the output of the transconductance element is adjusted by a scaling factor that is based on a supply voltage of the power amplifier;
a reference element that provides an output bias current responsive to a static reference current and the boost current;
a bias element having an input that receives the bias current and is arranged to provide a bias control output;
a power amplifier responsive to the bias control output and arranged to provide an amplified power output, wherein the power amplifier provides a first amount of power gain during a first time period after the power amplifier is powered on, the first amount of power gain responsive to the sum of the boost current and the static reference current and a second amount of power gain during a second time period after the power amplifier is powered on, the second time period following the first time period, the second amount of power gain determined by decay of the output bias current to a value of the static reference current; and
a power scaling element that adjusts the boost current by a power scaling factor that is based on the output power of the power amplifier.

7. The circuit of claim 6, wherein the power scaling factor is proportional to the magnitude of the output power of the power amplifier.

8. The circuit of claim 6, wherein the power scaling factor is proportional to the magnitude of the output power of the power amplifier.

9. A method of correcting for a start-up transient in a power amplifier, comprising:
producing a boost current having a decay characteristic;
producing a static reference current;

adjusting the boost current by a scaling factor that is based on a supply voltage of the power amplifier and an input power of the power amplifier;
summing the boost current and the static reference current;
applying the summed boost current and the static reference current to bias a power amplifier;
wherein the boost current is produced by a delay element having an input that receives an enabling control signal and is arranged to provide an output that includes a delay output signal and a transconductance element having an input that receives the delay output voltage from the delay element and is arranged to provide an output that includes the boost current that is based on the delay output voltage and a gain of the transconductance element, wherein the delay element includes a switch and at least one resistor coupled together in series.

10. A method of correcting for a start-up transient in a power amplifier, comprising:
producing a boost current having a decay characteristic;
producing a static reference current;
adjusting the boost current by a scaling factor that is based on a supply voltage of the power amplifier and an input power of the power amplifier;
summing the boost current and the static reference current;
applying the summed boost current and the static reference current to bias a power amplifier;
wherein the boost current is produced by a delay element having an input that receives an enabling control signal and is arranged to provide an output that includes a delay output signal and a transconductance element having an input that receives the delay output voltage from the delay element and is arranged to provide an output that includes the boost current that is based on the delay output voltage and a gain of the transconductance element, wherein the transconductance element includes a switch and at least one resistor coupled together in series.

11. A method of correcting for a start-up transient in a power amplifier, comprising:
producing a boost current having a decay characteristic;
producing a static reference current;
adjusting the boost current by a scaling factor that is based on a supply voltage of the power amplifier and an input power of the power amplifier, wherein the scaling factor is a voltage scaling factor that is proportional to the supply voltage and a power scaling factor that is proportional to the magnitude of an output power to the power amplifier;
summing the boost current and the static reference current;
applying the summed boost current and the static reference current to bias a power amplifier.

* * * * *